US010446233B2

(12) United States Patent
Arsovski et al.

(10) Patent No.: US 10,446,233 B2
(45) Date of Patent: Oct. 15, 2019

(54) SENSE-LINE MUXING SCHEME

(71) Applicant: GLOBALFOUNDRIES INC., Grand Cayman (KY)

(72) Inventors: Igor Arsovski, Williston, VT (US); Qing Li, Shanghai (CN); Xiaoli Hu, Shanghai (CN); Wei Zhao, Shanghai (CN); Jieyao Liu, Beijing (CN)

(73) Assignee: GLOBALFOUNDRIES INC., Grand Cayman (KY)

( * ) Notice: Subject to any disclaimer, the term of this patent is extended or adjusted under 35 U.S.C. 154(b) by 2 days.

(21) Appl. No.: 15/684,492

(22) Filed: Aug. 23, 2017

(65) Prior Publication Data

US 2019/0066786 A1 Feb. 28, 2019

(51) Int. Cl.
*G11C 15/04* (2006.01)
*G11C 11/419* (2006.01)
G11C 7/06 (2006.01)
G11C 7/12 (2006.01)

(52) U.S. Cl.
CPC ........... *G11C 15/04* (2013.01); *G11C 11/419* (2013.01); *G11C 7/065* (2013.01); *G11C 7/12* (2013.01); *G11C 2207/002* (2013.01)

(58) Field of Classification Search
CPC .................. G11C 15/04; G11C 11/419
See application file for complete search history.

(56) References Cited

U.S. PATENT DOCUMENTS

| 6,519,204 | B2 | 2/2003 | Slamowitz et al. | |
|---|---|---|---|---|
| 7,102,945 | B2 * | 9/2006 | Tsuchida | G11C 7/06 365/189.09 |
| 7,751,218 | B2 * | 7/2010 | Arsovski | G11C 7/067 327/51 |

OTHER PUBLICATIONS

S. Yoshimoto et al, "A 40-nm 8T SRAM with Selective Source Line Control of Read Bitlines and Address Preset Structure", Semiconductor Technology Academic Research Center, University of Tokyo, 2013 IEEE, 4 pages.

* cited by examiner

*Primary Examiner* — Tri M Hoang
(74) *Attorney, Agent, or Firm* — Michael LeStrange; Andrew M. Calderon; Roberts Mlotkowski Safran Cole & Calderon P.C.

(57) ABSTRACT

The present disclosure relates to a structure which includes a self-referenced multiplexer circuit which is configured to pre-charge a plurality of sense lines to a voltage threshold in a first time period and sense and detect a value of a selected sense line of the sense lines in a second time period.

19 Claims, 3 Drawing Sheets

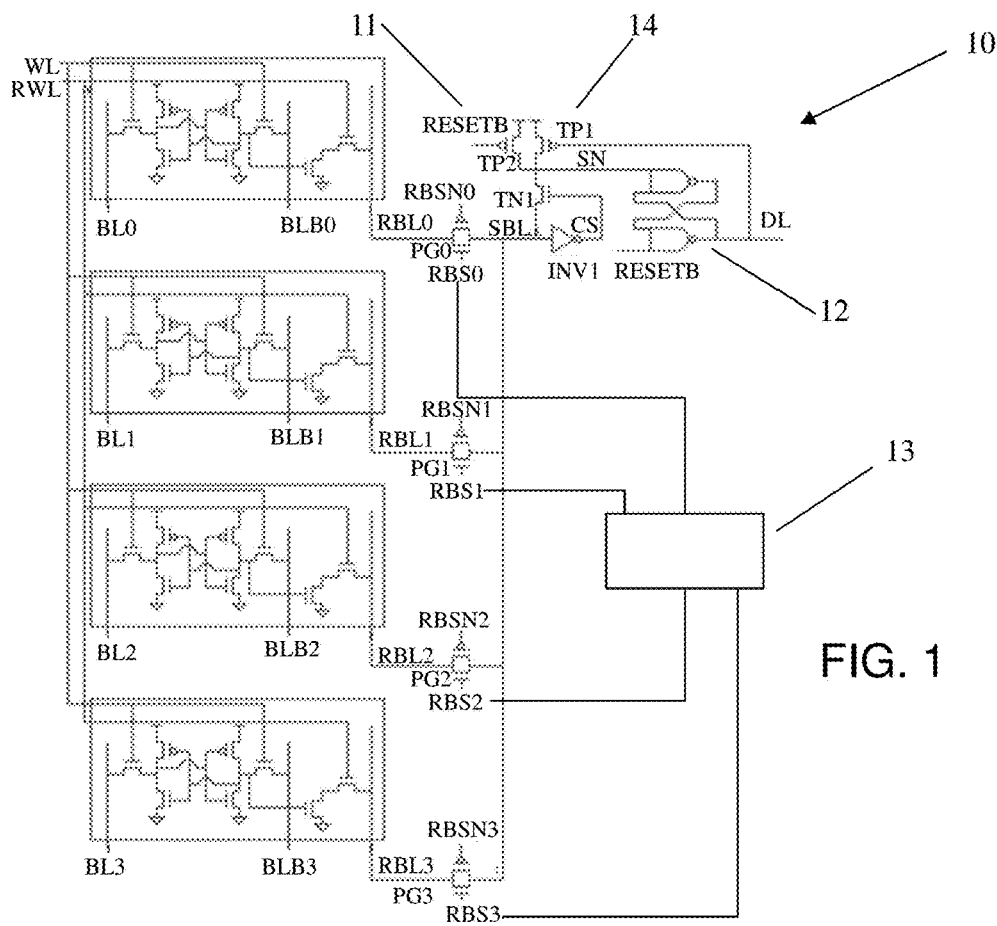
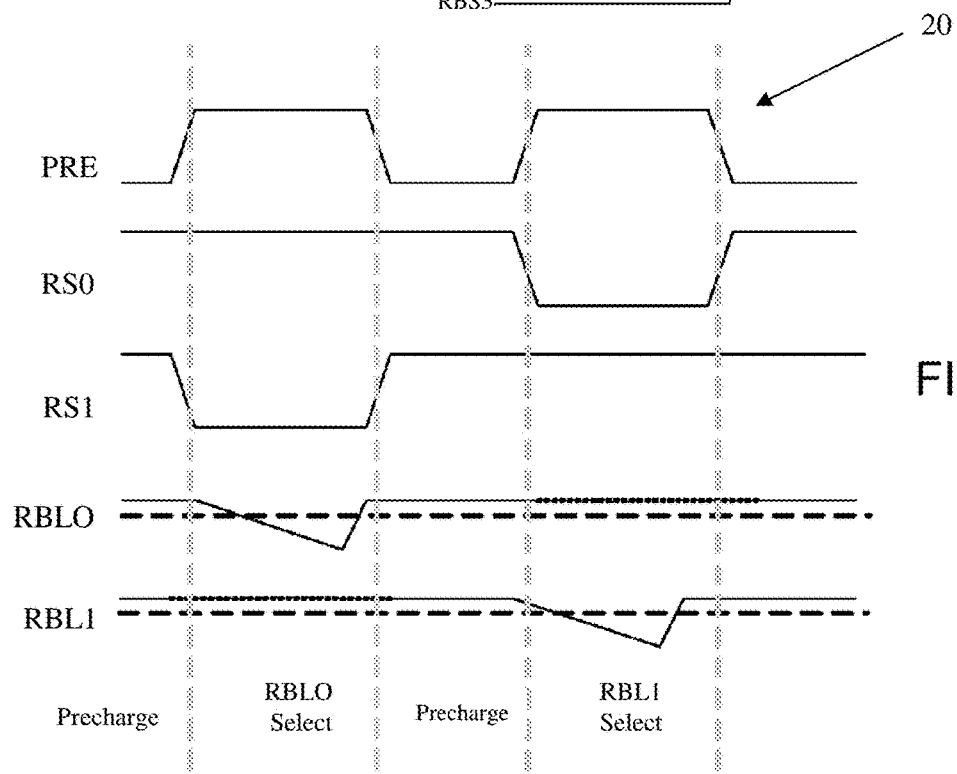

| bank | cpbl | mux | total cpp | save cpp | area saving by percentage |
|---|---|---|---|---|---|
| 1 | 16 | 2 | 553 | 36 | 6.51% |
| 1 | 16 | 4 | 553 | 44 | 7.96% |
| 4 | 128 | `4/8/16 | 2917 | 176 | 6.03% |
| 4 | 128 | 2 | 2917 | 144 | 4.94% |

SENSE-LINE MUXING SCHEME

FIELD OF THE INVENTION

The present disclosure relates to a sense-line muxing scheme, and more particularly, to a sense-line muxing scheme for a self-referencing sensing circuit.

BACKGROUND

Memory chips comprise an array of memory cells which are interconnected by bit lines and word lines. The word lines and bit lines are used to read and write binary values to each of the memory cells. Each of the memory cells represents a bit of information. Since each memory cell represents a bit of information and may be connected to other circuitry, it is desirable that the electrical and operational characteristics of all memory cells be consistent.

Single ended sensing is often used with a matchline (ML) in Content Addressable Memory (CAM) and a bitline in eight-transistor Static Random Access Memory (8T SRAM). Often, these lines are held low when idle to save leakage power. To perform an operation, the matchlines or bitlines are pre-charged and then evaluated (e.g., sensed). However, single ended sensing has issues of performance due to random device variations (RDV).

Self-referenced sense amplifiers address the problems associated with RDV by performing a self-calibration to their respective thresholds to reduce the effects of RDV between adjacent sense amplifiers. Conventional self-referenced sense amplifiers require a globally timed signal, i.e., a clock-based signal that is applied to a plurality of sense amplifiers to have the same amount of pre-charge time. However, due to process variations, some sense amplifiers may not require the full-pre charge time in order to reach their particular pre-charge level. This results in some sense amplifiers sitting idle in the pre-charge phase after they have reached their pre-charge level but before the globally timed signal turns off the pre-charge.

SUMMARY

In an aspect of the disclosure, a structure includes a self-referenced multiplexer circuit which is configured to pre-charge a plurality of sense lines to a voltage threshold in a first time period and sense and detect a value of a selected sense line of the sense lines in a second time period.

In another aspect of the disclosure, a structure includes a self-referenced multiplexer circuit which includes a self-referenced sense amplifier configured to self-calibrate by pre-charging an input to a voltage threshold and transfer the input to a plurality of sense lines during a pre-charging time period and at least one multiplexer configured to close all unselected multiplexer legs and open a selected multiplexer leg to sense and detect a value of a selected sense line of the sense lines during a sense and detect time period.

In another aspect of the disclosure, a method includes pre-charging a plurality of sense lines to a voltage threshold in a first time period, selecting a sense line of the plurality of sense lines in a second time period, and sensing and detecting a value of the selected sense line in the second time period.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 1 shows a muxing scheme with a self-referenced sense amplifier in accordance with aspects of the present disclosure.

FIG. 2 shows a graph of the signals in the muxing scheme with the self-referenced sense amplifier in accordance with aspects of the present disclosure.

DETAILED DESCRIPTION

Figures 3, 4:
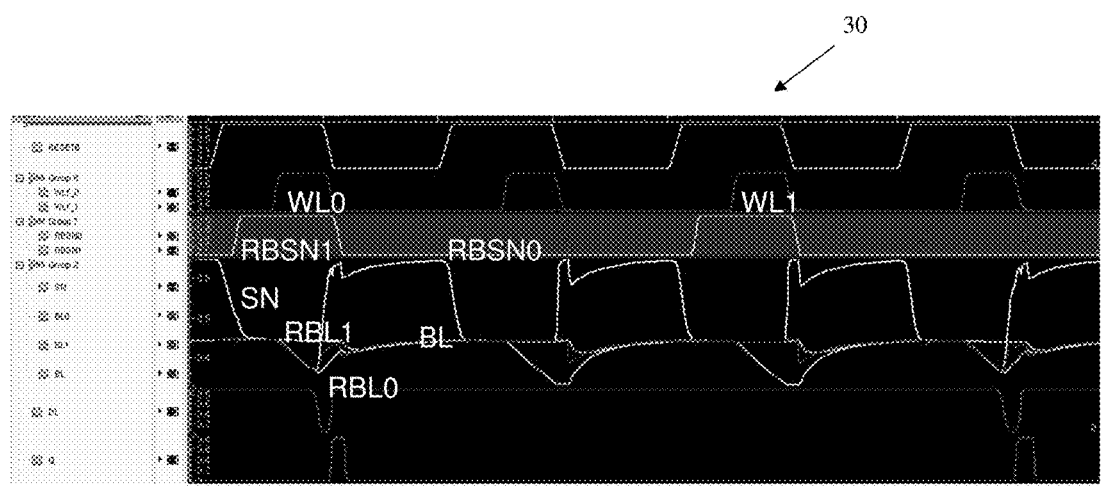
FIG. 3 shows another graph of the signals in the muxing scheme with the self-referenced sense amplifier in accordance with aspects of the present disclosure.
FIG. 4 shows a table of an area saving estimation of the muxing scheme with the self-referenced sense amplifier in accordance with aspects of the present disclosure.

The present disclosure relates to a sense-line muxing scheme, and more particularly, to a sense-line muxing scheme for a self-referencing sensing circuit. The present disclosure relates to using complementary pass gates on each bitline column to transmit signals.

Advantageously, by implementing the scheme described herein, it is now possible to reduce circuit area and power consumption in a sense-line muxing scheme for a self-referencing sensing circuit. In the present disclosure, the timing of bit switches are set in a way that all columns are connected to sensing circuits when the sensing circuits are not being read in order to keep the sensing circuits pre-charged to a middle voltage level. Further, in the present disclosure, the unselected columns are shut off while the selected columns are connected to a sense amplifier to avoid coupling from the bit switch.

A mux scheme is important in memory designs to enable variant configurations covering wide words and bits. In conventional systems, a memory with a self-referencing circuit does not work well with a known multiplexing scheme which uses a single PFET to transmit a high voltage level. In particular, a single PFET is used as a bit switch to transmit a "1" for a large sense signal; however, using a single PFET with a large sense signal is not appropriate for a self-referencing sense amplifier circuit which detects a small voltage swing. In fact, a bitline in a self-referencing sense amplifier circuit operates with a middle voltage level and a sensing signal uses a minimal voltage swing. Therefore, transmitting a middle voltage level modulated with a relatively small voltage signal becomes difficult. Further, when using a multiplexer at an output of multiple self-reference sense amplifiers, a larger area and greater power consumption is required.

In contrast, in the present disclosure, a self-reference sense amplifier can determine a pre-charge voltage for more than one sense line. Further, in the present disclosure, complementary bit switches on each sense line can control the pre-charge and sense phases. Therefore, a bit switch signal is leveraged to complete the bitline pre-charge phase. Further, the present disclosure can avoid floating an unselected bitline and can achieve a small bitline voltage swing. The present disclosure can also allow sharing of a sense amplifier between half-banks and removing a multiplexer at an output of the sense amplifier to save area and power consumption.

FIG. 1 shows a muxing scheme with a self-referenced sense amplifier in accordance with aspects of the present disclosure. In FIG. 1, a structure 10 includes a write line WL, a read write line RWL, bitlines BL0, BL1, BL2, BL3, BLB0, BLB1, BLB2, BLB3, and read bitlines RBL0, RBL1, RBL2, RBL3. The structure 10 also includes pass gates PG0, PG1, PG2, PG3, pass gate input signals RBS0, RBS1, RBS2, RBS3, and pass gate inverted input signals RBSN0, RBSN1, RBSN2, RBSN3. Further, the structure 10 includes a reset signal RESETB, PMOS transistors TP1, TP2, NMOS transistor TN1, a sensing node SN, a sense amplifier input SBL, a cross signal CS, an inverter INV1, a sense output data line DL, a SR latch 12, and a control block 13.

In FIG. 1, the control block 13 controls each of the pass gate input signals RBS0, RBS1, RBS2, and RBS3 in both the pre-charge and sensing phases. Further, the control block 13 controls each multiplexer leg (e.g., a leg of pass gates PG0, PG1, PG2, and PG3) of the at least one multiplexer (e.g., pass gates PG0, PG1, PG2, PG3) to either open or close.

In FIG. 1, the structure 10 includes a self-referenced multiplexer circuit 11 which is configured to pre-charge a plurality of sense lines (e.g., read bitlines RBL0, RBL1, RBL2, RBL3) to a voltage threshold in a first time period and sense and detect a value of a selected sense line (e.g., one of read bitlines RBL0, RBL1, RBL2, RBL3) of the sense lines in a second time period. The first time period can be a pre-charge time period and the second time period can be a sense and detect time period. The self-referenced multiplexer circuit 11 includes the pass gates PG0, PG1, PG2, PG3, pass gate input signals RBS0, RBS1, RBS2, RBS3, pass gate inverted input signals RBSN0, RBSN1, RBSN2, RBSN3, and a self-referenced sense amplifier 14. In addition, the self-referenced multiplexer circuit 11 is further configured to self-calibrate by pre-charging an input (e.g., reset signal RESETB) to the voltage threshold of the self-referenced sense amplifier 14 and transfer the input (i.e., the voltage threshold of the self-referenced sense amplifier 14) to the plurality of sense lines (e.g., read bitlines RBL0, RBL1, RBL2, RBL3) coupled to the self-referenced sense amplifier during the first time period, e.g., pre-charge time period. The self-referenced multiplexer circuit 11 includes at least one multiplexer (e.g., at least one of the pass gates PG0, PG1, PG2, PG3) to transfer the input (e.g., reset signal RESETB) of the self-referenced sense amplifier 14 to the plurality of sense lines (e.g., read bitlines RBL0, RBL1, RBL2, RBL3) during the first time period.

In FIG. 1, the self-referenced sense amplifier 14 of the structure 10 includes an inverter INV1 with an input connected to the sense amplifier input SBL and output connected to a gate of the NMOS transistor TN1. In the self-referenced sense amplifier 14, the NMOS transistor TN1 is coupled to a drain of the PMOS transistor TP1 and the sense amplifier input SBL. Further, the gate of the NMOS transistor TN1 is connected to the cross signal CS. In addition, in the self-referenced sense amplifier 14, the PMOS transistor TP1 is coupled to a drain of the NMOS transistor TN1 and a voltage reference signal. Further, the gate of the PMOS transistor TP1 is connected to the sense output data line DL. The PMOS transistor TP2 in the self-referenced sense amplifier 14 is parallel connected to the PMOS transistor TP1. Further, the PMOS transistor TP2 is coupled to the sensing node SN and the voltage reference signal. Further, the gate of the PMOS transistor TP2 is connected to the reset signal RESETB. In the present disclosure, the beginning phase of the bitline pre-charge is triggered by the sense output data line DL. The self-referenced sense amplifier 14 also includes the SR latch 12 which has a first input from the reset signal RESETB and a second input from a drain of the PMOS transistor TP2 and outputs the sense output data line DL.

Still referring to FIG. 1, each of the pass gates PG0, PG1, PG2, PG3 are a complementary MOSFET which can transfer a pre-charged threshold level by a PMOS FET when the corresponding signal of the pass gate input signals RBS0, RBS1, RBS2, RBS3 is set to "0". Further, each of the pass gates PG0, PG1, PG2, PG3 can transfer a low voltage level by a NMOS FET when the corresponding signal of the pass gate input signals RBS0, RBS1, RBS2, RBS3 is set to "1". Thus, each of the pass gates PG0, PG1, PG2, PG3 can connect the corresponding signal of the read bitlines RBL0, RBL1, RBL2, RBL3 to the sense amplifier input SBL.

Further, the pass gate inverted input signals RBSN0, RBSN1, RBSN2, RBSN3 are inverted signals of the pass gate input signals RBS0, RBS1, RBS2, RBS3. When evaluating (e.g., sensing), only the selected column's pass gate (i.e., one of the pass gates PG0, PG1, PG2, PG3) will be shorted to connect the corresponding signal of the read bitlines RBL0, RBL1, RBL2, RBL3 to the self-referenced sense amplifier 14. The pass gates PG0, PG1, PG2, PG3 can be used at a pre-charge phase for all of the columns and used as a multiplexer at an evaluating (i.e., sensing) phase.

In the present disclosure, only one sense amplifier is needed for all four columns corresponding to the pass gates PG0, PG1, PG2, PG3. Thus, the present disclosure saves area in comparison to conventional systems. Further, the present disclosure saves ¾ the cost in the muxing scheme in comparison to known systems which have a multiplexer select at an input/output (IO) block. In the self-referenced multiplexer circuit 11, the at least one multiplexer includes at least one pass gate (e.g., one of PG0, PG1, PG2, PG3) and a plurality of bit switches (e.g., pass gates PG0, PG1, PG2, PG3) which correspond with the plurality of sense lines (read bitlines RBL0, RBL1, RBL2, RBL3). The voltage threshold can be approximately half of a voltage of a power supply VCS which powers the self-referenced multiplexer circuit 11.

In FIG. 1, in a pre-charge phase, the reset signal RESETB goes from a pre-charged threshold level to a low level. In this pre-charge phase, all of the pass gates PG0, PG1, PG2, PG3 are shorted (i.e., the pass gate input signals RBS0, RBS1, RBS2, RBS3 are set to "0") in order to make the read bitlines RBL0, RBL1, RBL2, RBL3 pre-charged with the sense amplifier input SBL. PMOS transistor TP2 is open and the signal on the sensing node SN is pre-charged to a pre-charged threshold level. The output of the sense output data line DL is set to a pre-charged threshold level. Further, at the static state, the read bitlines RBL0, RBL1, RBL2, RBL3, and the sense amplifier input SBL all have the same voltage level.

In FIG. 1, in an evaluating (i.e., sensing) phase, a column, e.g., column 0 (which corresponds to the pass gate PG0) is selected. In this way, the pass gate input signal RBS0 is set to "1" and the pass gate inverted input signal RBSN0 is set to "0" to ensure that the pass gate PG0 is shorted. The reset signal RESETB goes from a low level to a pre-charged threshold level and the transistor TP2 is closed. Columns 1, 2, and 3 are unselected by setting the pass gate input signals RBS1, RBS2, and RBS3 to "0" and the pass gate inverted input signals RBSN1, RBSN2, and RBSN3 to "1". As a result, the sense amplifier input SBL is connected to the read bitline RBL0 by the shorted pass gate PG0.

If the bitcell restores a "0", then the read bitline RBL0 will discharge and a voltage level of the sense amplifier input SBL will become lower than a threshold voltage of the inverter INV1. The cross signal CS will go high and turn on NMOS transistor TN1, and the signal on the sensing node will be pulled down by the sense amplifier input SBL and the sense output data line DL will drop to a low level (i.e., "0"). If the bitcell restores a "1", the read bitline RBL0 will keep higher than the threshold voltage of INV1 and the sense output data line DL will stay at a pre-charged threshold level (i.e., "1").

Although the example above shows column 0 (which corresponds to the pass gate PG0) being selected, the same operation will occur if column 1 (which corresponds to the pass gate PG1), column 2 (which corresponds to the pass gate PG2), or column 3 (which corresponds to the pass gate PG3) is selected. Further, although FIG. 1 shows four pass gates (i.e., a four multiplexer scheme), the present disclosure can include two pass gates, six pass gates, eight pass gates, etc. In the structure 10, the at least one multiplexer (e.g., at least one of the pass gates PG0, PG1, PG2, PG3) closes all unselected multiplexer legs (e.g., legs of pass gates PG1, PG2, PG3) an opens a multiplexer leg (e.g., leg of pass gate PG0) to sense and detect the value of the selected sense line (e.g., read bitline RBL0) during a second time period. The second time period is a sense and detect time period.

FIG. 2 shows a graph of the signals in the muxing scheme with the self-referenced sense amplifier in accordance with aspects of the present disclosure. In FIG. 2, the y-axis of the graph 20 shows each of the signals PRE, RS0, RS1, RBL0, and RBL1. The signal PRE corresponds to a pre-charge signal. Further, the read bitline signals RBL0 and RBL1 correspond to a first bitline BL0 and a second bitline BL1, respectively. The signals RS0 and RS1 correspond to read bitline signals RBL0, RBL1 for the first bitline BL0 and the second bitline BL1, respectively. Although only read bitline signals RBL0 and RBL1 are shown in the graph of FIG. 2, embodiments are not limited and can also include read bitlines signals RBL2, RBL3, etc. (which correspond to pass gates PG2 and PG3). The x-axis in the graph 20 is a time period which includes a first time period which includes a pre-charge period, a second time period which includes the read bitline signal RBL0 being selected, a third time period which includes another pre-charge period, and a fourth time period which includes the read bitline RBL1 being selected.

In FIG. 2, in the first time period, which includes the pre-charge period, the signal PRE goes from a low level to a pre-charged threshold level and the signal RS1 goes from a pre-charged threshold level to a low level. The read bitline signals RBL0 and RBL1 stay at a pre-charged threshold level. The signal RS0 also stays at a pre-charged threshold level. In the second time period, which includes the read bitline signal RBL0 being selected, the read bitline signal RBL0 goes from a pre-charged threshold level to a low level and the signal RS1 stays at a low level. The signal PRE and the signal RS0 stays at the pre-charged threshold level during the second time period. Further, the read bitline signal RBL1 also stays at a pre-charged threshold level during the second time period.

Still referring to FIG. 2, in the third time, period which includes another pre-charge period, the read bitline signals RBL0 and RBL1 stay at a pre-charged threshold level. The signal RS1 also goes from a low level to a pre-charged threshold level and the signal RS0 stays at a pre-charged threshold level in the third time period. The signal PRE goes from the pre-charged threshold level to the low level in the third time period. In the fourth time period, which includes the read bitline signal RBL1 being selected, the read bitline signal RBL1 goes from a pre-charged threshold level to a low level and the signal RS1 stays at a pre-charged threshold level. The signal PRE and the read bitline RBL0 stay at a pre-charged threshold level in the fourth time period. Further, the signal RS0 goes from a pre-charged level to a low level in the fourth time period.

FIG. 3 shows another graph of the signals in the muxing scheme with the self-referenced sense amplifier in accordance with aspects of the present disclosure. In FIG. 3, another graph 30 includes a y-axis with the voltage signals in volts and an x-axis with the time periods corresponding to the time periods in FIG. 2. Further, the y-axis shows a list of signals of FIG. 1 which include the reset signal RESETB, write line WL0 (which corresponds to the first bitline column), write line WL1 (which corresponds to the second bitline column), a pass gate inverted input signal RBSN0 (which corresponds to the first bitline column), a pass gate inverted input signal RBSN1 (which corresponds to the second bitline column), and the sensing node SN. Further, as shown in FIG. 3, during a pre-charge phase, all four bit switches (i.e., pass gates) are turned on so that the four bitline columns get pre-charged to a value of VCS/2 (i.e., half the voltage supply VCS). Then, during a sensing phase, three bit switches are turned off by being unselected. Thus, only a selected read bitline (e.g., RBL1) gets connected to the sense amplifier for sensing. After the sensing phase is completed, the three bit switches are turned on again for another pre-charge phase. Thus, the dynamic power is kept lower by only executing a small-signal sensing, which is different from known systems which require full voltage swings from VDD (i.e., power supply level) to GND.

FIG. 4 shows a table of an area saving estimation of the muxing scheme with the self-referenced sense amplifier in accordance with aspects of the present disclosure. As shown in the table 40 of FIG. 4, using one bank with a number of cells per bitline (CPBL) being 16 with a multiplexer (MUX)-2 scheme, the total cpp (i.e., area) is 553 with an area saving of 36 cpp. Thus, the area saving by percentage is 6.51% over conventional systems. Using one bank with a number of cells per bitline (CPBL) being 16 with a multiplexer (MUX)-4 scheme, the total cpp (i.e., area) is 553 with an average savings of 44 cpp (approximately 7.96% area saving by percentage) over conventional systems. Using four banks with a number of cells per bitline (CPBL) being 128, with a multiplexer (MUX)-4 or MUX-8 or MUX-16 scheme, the total cpp (i.e., area) is 2917 with an average savings of 176 cpp (approximately 6.03% area saving by percentage) over conventional systems. Further, using four banks with a number of cells per bitline (CPBL) being 128, with a multiplexer (MUX)-2 scheme, the total cpp (i.e., area) is 2917 with an average savings of 144 (approximately 4.94% area savings by percentage) over conventional systems. Thus, the muxing scheme of the claimed invention enables the sense amplifier to be shared by half banks in order to save area.

Figure 5:
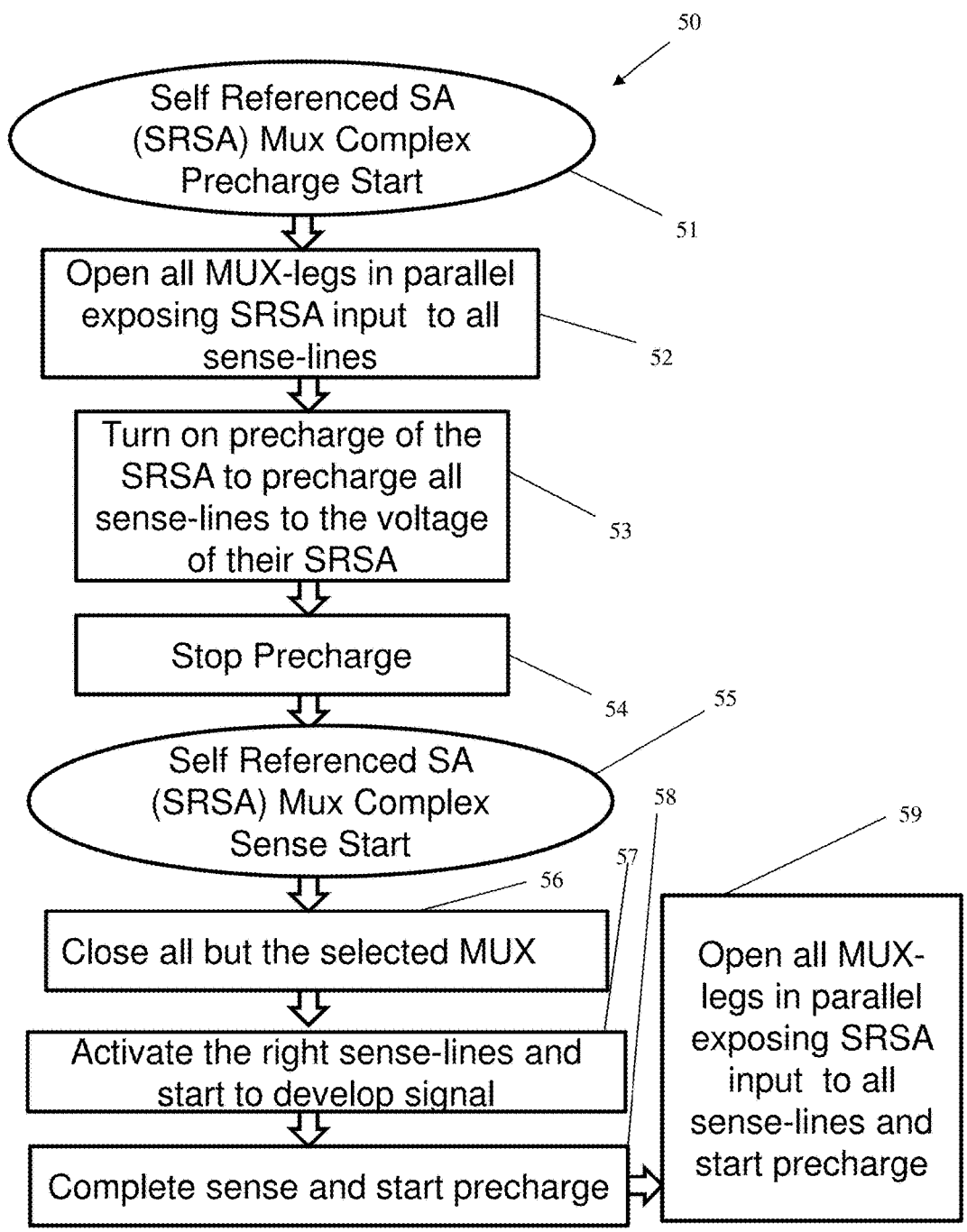
FIG. 5 shows a flowchart of the muxing scheme with the self-referenced sense amplifier in accordance with aspects of the present disclosure.

FIG. 5 shows a flowchart of the muxing scheme with the self-referenced sense amplifier in accordance with aspects of the present disclosure. In the flowchart 50, steps 51-54 are part of a pre-charge operation and steps 55-59 are part of a sensing operation. The flowchart 50 starts at step 51 in which the self referenced sense amplifier (SRSA) multiplexer complex starts a pre-charge process. In step 52, all multiplexer (MUX)-legs in the pre-charge process are opened in parallel to expose the SRSA input to all sense-lines. At step 53, the pre-charge of the SRSA is turned on to pre-charge all sense-lines to a voltage of the SRSA. At step 54, the pre-charge process is completed and pre-charging of the sense-lines is stopped. At step 55, the SRSA MUX complex sensing process starts. At step 56, all MUX-legs are closed but the selected MUX. As an example, in a MUX-4 scheme, a first MUX may be opened while the remaining MUX-legs are closed.

At step 57, the corresponding sense-lines to the opened MUX are activated and a sense signal is developed in the SRSA multiplexer complex. At step 58, the sensing is completed and a pre-charge process is started again. At step 59, all MUX-legs in the pre-charge process are opened again in parallel to expose the SRSA input to all sense-lines. Thus, in the flowchart 50, a plurality of sense lines are pre-charged to a voltage threshold in a first time period, a sense line of the plurality of sense lines is selected in a second time period, and a value of the selected sense line is sensed and detected in the second time period.

The circuit and method for a muxing scheme with a self-referenced sense amplifier of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for a muxing scheme with a self-referenced sense amplifier of the present disclosure has been adopted from integrated circuit (IC) technology. For example, the structures are built on wafers and are realized in films of material patterned by photolithographic processes on the top of a wafer. In particular, the fabrication of the circuit and a method for a muxing scheme with a self-referenced sense amplifier uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a self-referenced multiplexer circuit which is configured to pre-charge a plurality of sense lines to a voltage threshold in a first time period and sense and detect a value of a selected sense line of the sense lines in a second time period,
    wherein the self-referenced multiplexer circuit further comprises a self-referenced sense amplifier and at least one multiplexer which opens all multiplexer legs to transfer an input of the self-referenced self amplifier to the plurality of sense lines during the first time period,
    the self-referenced sense amplifier comprises a first PMOS transistor and a second PMOS transistor, the first PMOS transistor has a gate connected to a reset signal and a drain connected to a set-reset (SR) latch, and
    the SR latch receives the reset signal and outputs a signal to a gate of the second PMOS transistor of the self-referenced sense amplifier.

2. The structure of claim 1, wherein the self-referenced sense amplifier is configured to self-calibrate by pre-charging the input to the voltage threshold of the self-referenced sense amplifier and transferring the voltage threshold in the input to the plurality of sense lines coupled to the self-referenced sense amplifier during the first time period.

3. The structure of claim 1, wherein the self-referenced multiplexer circuit further comprises a control block which controls each multiplexer leg of the at least one multiplexer to either open or close.

4. The structure of claim 1, wherein the at least one multiplexer closes all unselected multiplexer legs and opens a selected multiplexer leg to sense and detect the value of the selected sense line during the second time period.

5. The structure of claim 1, wherein the at least one multiplexer comprises at least one pass gate which opens all multiplexer legs during the first time period and opens a selected multiplexer leg during the second time period.

6. The structure of claim 1, wherein the first time period is a pre-charge time period and the second time period is a sense and detect time period.

7. The structure of claim 1, further comprising a plurality of bit switches which control whether the plurality of sense lines are connected to the self-referenced sense amplifier during the first time period and the second time period.

8. The structure of claim 1, wherein the voltage threshold is approximately half of a voltage of a power supply which powers the self-referenced multiplexer circuit.

9. A structure comprising a self-referenced multiplexer circuit which comprises a self-referenced sense amplifier configured to self-calibrate by pre-charging an input to a voltage threshold and transfer the input to a plurality of sense lines during a pre-charging time period and at least one multiplexer configured to close all unselected multiplexer legs and open a selected multiplexer leg to sense and detect a value of a selected sense line of the sense lines during a sense and detect time period,
    wherein the at least one multiplexer is configured to open all multiplexer legs to transfer the input of the self-referenced sense amplifier to the plurality of sense lines during the pre-charging time period,
    the self-referenced sense amplifier comprises a first PMOS transistor and a second PMOS transistor, the first PMOS transistor has a gate connected to a reset signal and a drain connected to a set-reset (SR) latch, and
    the SR latch receives the reset signal and outputs a signal to a gate of the second PMOS transistor of the self-referenced sense amplifier.

10. The structure of claim 9, wherein the self-referenced multiplexer circuit further comprises a control block which controls each multiplexer leg of the at least one multiplexer to either open or close.

11. The structure of claim 9, wherein the at least one multiplexer comprises at least one pass gate which opens all multiplexer legs during the pre-charging time period and opens a selected multiplexer leg during the sense and detect time period.

12. The structure of claim 9, wherein the pre-charging time period occurs before the sense and detect time period.

13. The structure of claim 9, further comprising a plurality of bit switches which control whether the plurality of sense lines are connected to the self-referenced sense amplifier during the pre-charging time period and the sense and detect time period.

14. The structure of claim 9, wherein the voltage threshold is approximately half of a voltage of a power supply which powers the self-referenced multiplexer circuit.

15. A method, comprising:
pre-charging a plurality of sense lines to a voltage threshold in a first time period;
selecting a sense line of the plurality of sense lines in a second time period; and
sensing and detecting a value of the selected sense line in the second time period,
wherein the pre-charging the plurality of sense lines to the voltage threshold in the first time period comprises opening all multiplexer legs of at least one multiplexer to transfer an input of a self-referenced sense amplifier to the plurality of sense lines during the first time period,
the self-referenced sense amplifier comprises a first PMOS transistor and a second PMOS transistor, the first PMOS transistor has a gate connected to a reset signal and a drain connected to a set-reset (SR) latch, and
the SR latch receives the reset signal and outputs a signal to a gate of the second PMOS transistor of the self-referenced sense amplifier.

16. The method of claim 15, wherein the sensing and detecting the value of the selected sense line in the second time period comprises closing all unselected multiplexer legs of the at least one multiplexer and opening a selected multiplexer leg to sense and detect the value of the selected sense line during the second time period.

17. The method of claim 15, wherein the voltage threshold is approximately half of a voltage of a power supply which powers the self-referenced multiplexer circuit.

18. The structure of claim 1, wherein the self-referenced sense amplifier further comprises an inverter with an input connected to a sense amplifier input and an output of the inverter connected to a gate of a third transistor.

19. The structure of claim 18, wherein the third transistor is a NMOS transistor which is coupled to a drain of the second PMOS transistor and the sense amplifier input.

* * * * *